(12) United States Patent
Yu

(10) Patent No.: US 11,507,808 B2
(45) Date of Patent: Nov. 22, 2022

(54) MULTI-LAYER VECTOR-MATRIX MULTIPLICATION APPARATUS FOR A DEEP NEURAL NETWORK

(71) Applicant: Shimeng Yu, Tempe, AZ (US)

(72) Inventor: Shimeng Yu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 845 days.

(21) Appl. No.: 16/401,662

(22) Filed: May 2, 2019

(65) Prior Publication Data

US 2019/0370639 A1  Dec. 5, 2019

Related U.S. Application Data

(60) Provisional application No. 62/679,190, filed on Jun. 1, 2018.

(51) Int. Cl.
*G06N 3/063* (2006.01)
*G11C 16/04* (2006.01)
*G06F 17/16* (2006.01)

(52) U.S. Cl.
CPC ............. *G06N 3/063* (2013.01); *G06F 17/16* (2013.01); *G11C 16/0483* (2013.01)

(58) Field of Classification Search
CPC ............................ G11C 16/0483; G06F 17/16
USPC ..................................................... 365/185.17
See application file for complete search history.

(56) References Cited

U.S. PATENT DOCUMENTS

| 9,356,598 | B2 | 5/2016 | Vrudhula et al. | |
| 9,466,362 | B2 | 10/2016 | Yu et al. | |
| 9,934,463 | B2 | 4/2018 | Seo et al. | |
| 2017/0278571 | A1* | 9/2017 | Chowdhury | ...... H01L 27/11582 |
| 2018/0315473 | A1 | 11/2018 | Yu et al. | |

(Continued)

OTHER PUBLICATIONS

Burr, Geoffrey, et al., "Experimental demonstration and tolerancing of a large-scale neural network (165,000 synapses), using phase-change memory as the synaptic weight element," International Electron Devices Meeting. Dec. 2014, San Francisco, California, IEEE, 6 pages.

(Continued)

*Primary Examiner* — Anthan Tran
(74) *Attorney, Agent, or Firm* — Withrow & Terranova, P.L.L.C.

(57) ABSTRACT

A multi-layer vector-matrix multiplication (VMM) apparatus is provided. The multi-layer VMM apparatus includes a three-dimensional (3D) NAND flash structure having multiple transistor array layers each includes a number of transistors configured to store a respective weight matrix and a number of word lines configured to receive respective selection voltages corresponding to a respective input vector. Accordingly, each of the transistor array layers can perform a respective VMM operation by multiplying the respective selection voltages with the respective weight matrix. Thus, by providing the respective selection voltages to each of the multiple transistor array layers in a sequential order, it may be possible to carry out a multi-layer VMM operation in the 3D NAND flash structure with reduced footprint, thus making it possible to support a deep neural network (DNN) via such advanced techniques as in-memory computing.

10 Claims, 4 Drawing Sheets

(56) References Cited

U.S. PATENT DOCUMENTS

2018/0358101 A1* 12/2018 So .................. G11C 16/14
2019/0080755 A1   3/2019  Seo et al.

OTHER PUBLICATIONS

Cai, Yu, et al., "Threshold voltage distribution in MLC NAND flash memory: Characterization, analysis, and modeling," EDAA, Mar. 2013, IEEE, 6 pages.

Choi, Nagyong, et al., "First Demonstration of Diode-Type 3-D NAND Flash Memory String Having Super-Steep Switching Slope," Symposium on VLSI Technology, Digest of Technical Papers, 2017, JSAP, 2 pages.

Fukuda, Koichi, et al., "A 151-mm2 64-GB 2 Bit/Cell NAND Flash Memory in 24-nm CMOS Technology," Journal of Solid-State Circuits, vol. 47, Issue 1, Jan. 2012, IEEE, pp. 75-84.

Guo, X., et al. "Fast, Energy-Efficient, Robust, and Reproducible Mixed-Signal Neuromorphic Classifier Based on Embedded NOR Flash Memory Technology", International Electron Device Meeting, Dec. 2017, San Francisco, California, IEEE, 4 pages.

Guo, X., et al. "Temperature-Insensitive Analog Vector-by-Matrix Multiplier Based on 55 nm NOR Flash Memory Cells," Custom Integrated Circuits Conference, Apr. 2017, Austin, Texas, IEEE, 4 pages.

Hu, Miao, et al., "Dot-Product Engine for Neuromorphic Computing: Programming 1T1M Crossbar to Accelerate Matrix-Vector Multiplication," Design Automation Conference, Jun. 2016, Austin, Texas, ACM, 6 pages.

Kang, Dongku, et al., "256 GB 3 b/Cell V-NAND Flash Memory with 48 Stacked WL Layers," IEEE Journal of Solid-State Circuits, vol. 52, Issue 1, Jan. 2017, 8 pages.

Kim, Chulbum, et al., "A 512 GB 3-b/Cell 64-Stacked WL 3-D-NAND Flash Memory," Journal of Solid-State Circuits, vol. 53, Issue 1, Jan. 2018, IEEE, pp. 124-133.

Lue, Hang-Ting, et al., "Understanding STI Edge Fringing Field Effect on the Scaling of Charge-Trapping (CT) NAND Flash and Modeling of Incremental Step Pulse Programming (ISPP)," International Electron Devices Meeting, Dec. 2009, IEEE, 4 pages.

Park, Ki-Tae, et al., "Three-Dimensional 128 GB MLC Vertical NAND Flash Memory With 24-WL Stacked Layers and 50 MB/s High-Speed Programming," Journal of Solid-State Circuits, Sep. 2014, IEEE, 10 pages.

Prezioso, M., et al., "Training and operation of an integrated neuromorphic network based on metal-oxide memristors," Nature, vol. 521, May 2015, Macmillian Publishers Limited, 19 pages.

Sheridan, Patrick, et al., "Sparse coding with memristor networks," Nature Nanotechnoly, vol. 12, May 2017, Macmillan Publishers Limited, 7 pages.

Simonyan, Karen, et al., "Very Deep Convolutional Networks for Large-Scale Image Recognition," International Conference on Learning Representations, Apr. 2015, 14 pages.

Woo, Jiyong, et al., "Design Considerations of Selector Device in Cross-Point RRAM Array for Neuromorphic Computing," International Symposium on Circuits and Systems, May 2018, 4 pages.

Yao, Peng, et al., "Face classification using electronic synapses," Nature Communications, vol. 8, May 2017, 8 pages.

Yu, Shimeng, et al., "3D Vertical RRAM—Scaling Limit Analysis and Demonstration of 3D Array Operation," Symposium on VLSI Technology, Jun. 2013, Kyoto, Japan, IEEE, 2 pages.

Yu, Shimeng, "Neuro-Inspired Computing with Emerging Nonvolatile Memory," Proceedings of the IEEE, vol. 106, Issue 2, Feb. 2018, pp. 260-285.

* cited by examiner

MULTI-LAYER VECTOR-MATRIX MULTIPLICATION APPARATUS FOR A DEEP NEURAL NETWORK

RELATED APPLICATIONS

This application claims the benefit of provisional patent application Ser. No. 62/679,190, filed Jun. 1, 2018, the disclosure of which is hereby incorporated herein by reference in its entirety.

FIELD OF THE DISCLOSURE

The technology of the disclosure relates generally to vector-matrix multiplication (VMM) in a deep neural network (DNN).

BACKGROUND

Data-intensive applications such as machine/deep learning demand novel hardware platforms that minimize the data movement. Deep neural networks (DNNs) have shown remarkable improvements in various intelligent applications including image/speech recognition. However, the high demands on memory storage capacity and computational resources make it power hungry and energy inefficient to implement DNNs on-chip. For example, one of the representative DNN algorithms, VGG-16 network, requires 138 megabytes parameters and requires 15.5 gigabytes of floating-point precision multiply-and-accumulate operations to classify one 224-by-224 input image and these numbers can become even higher for a deeper neural network with an increased number of neurons layers. Therefore, it is prohibitive to store and process hundreds of megabytes or even gigabytes parameters on-chip with a few megabytes of synchronous random-access memory (SRAM) cache. The frequent data access from off-chip dynamic random-access memory (DRAM) becomes the bottleneck of the entire system. To address this challenge, it is thus attractive to perform in-memory computing, wherein the arithmetic computation occurs at the location where the data are stored, thus reducing the amount of data transfer. In this regard, emerging nonvolatile memory (eNVM)-based crossbar array architecture has been proposed to implement vector—matrix multiplication (VMM), which may be one of the most computation-intensive operations in the DNNs. However, the eNVM may be technologically immature for large-scale integration and the so-called sneak path effect may limit density of the eNVM-based crossbar array. Further, integrating a selector device with the eNCM-based crossbar array may increase the current-voltage (I-V) nonlinearity and thus compromise computation accuracy. So far, only small-scale or medium-scale DNNs may be implemented, which may be eNVMs or two-dimensional (2D) NOR flash technology.

Notably, the state-of-the-art DNN algorithms typically employ a much larger parameter size. Among all the nonvolatile memory technologies, three-dimensional (3D) NAND flash has been demonstrated as technologically mature and commercially competitive. However, a conventional 3D NAND flash is mainly configured to store data, as opposed to performing VMM. As such, it may be desired to reconfigure the conventional 3D NAND flash and develop new supporting structure such that the conventional 3D NAND flash can be adapted to support VMM in a DNN.

SUMMARY

Aspects disclosed in the detailed description relate to a multi-layer vector-matrix multiplication (VMM) apparatus for a deep neural network (DNN). In examples discussed herein, the multi-layer VMM apparatus includes a three-dimensional (3D) NAND flash structure having multiple transistor array layers. Specifically, each of the transistor array layers includes a number of transistors configured to store a respective weight matrix and a number of word lines configured to receive respective selection voltages corresponding to a respective input vector. Accordingly, each of the transistor array layers can perform a respective VMM operation by multiplying the respective selection voltages with the respective weight matrix. Thus, by providing the respective selection voltages to each of the multiple transistor array layers in a sequential order, it may be possible to carry out a multi-layer VMM operation in the 3D NAND flash structure. By utilizing the 3D NAND flash structure to carry out the multi-layer VMM operation, it may be possible to reduce footprint of the multi-layer VMM apparatus, thus making it possible to support a DNN via using such advanced techniques as in-memory computing.

In one aspect, a multi-layer VMM apparatus is provided. The multi-layer VMM apparatus includes a 3D NAND flash structure. The 3D NAND flash structure includes at least one first transistor array layer coupled to a number of bit lines. The first transistor array layer includes a number of first transistors configured to store at least one first weight matrix. The first transistor array layer also includes a number of first word lines configured to receive a number of selection voltages corresponding to at least one first input vector. The 3D NAND flash structure also includes at least one second transistor array layer coupled between the first transistor array layer and a number of source lines. The second transistor array layer includes a number of second transistors configured to store at least one second weight matrix. The second transistor array layer also includes a number of second word lines configured to receive the selection voltages corresponding to at least one second input vector. The multi-layer VMM apparatus also includes a control circuit. The control circuit is configured to cause the first transistor array layer to perform at least one first VMM operation to multiply the first input vector with the first weight matrix. The control circuit is also configured to cause the second transistor array layer to perform at least one second VMM operation to multiply the second input vector with the second weight matrix.

In another aspect, a 3D NAND flash structure is provided. The 3D NAND flash structure includes at least one first transistor array layer coupled to a number of bit lines. The first transistor array layer includes a number of first transistors configured to store at least one first weight matrix. The first transistor array layer also includes a number of first word lines configured to receive a number of selection voltages corresponding to at least one first input vector. The 3D NAND flash structure also includes at least one second transistor array layer coupled between the first transistor array layer and a number of source lines. The second transistor array layer includes a number of second transistors configured to store at least one second weight matrix. The second transistor array layer also includes a number of second word lines configured to receive the selection voltages corresponding to at least one second input vector. The first transistor array layer is configured to perform at least one first VMM operation to multiply the first input vector with the first weight matrix. The second transistor array layer is configured to perform at least one second VMM operation to multiply the second input vector with the second weight matrix.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
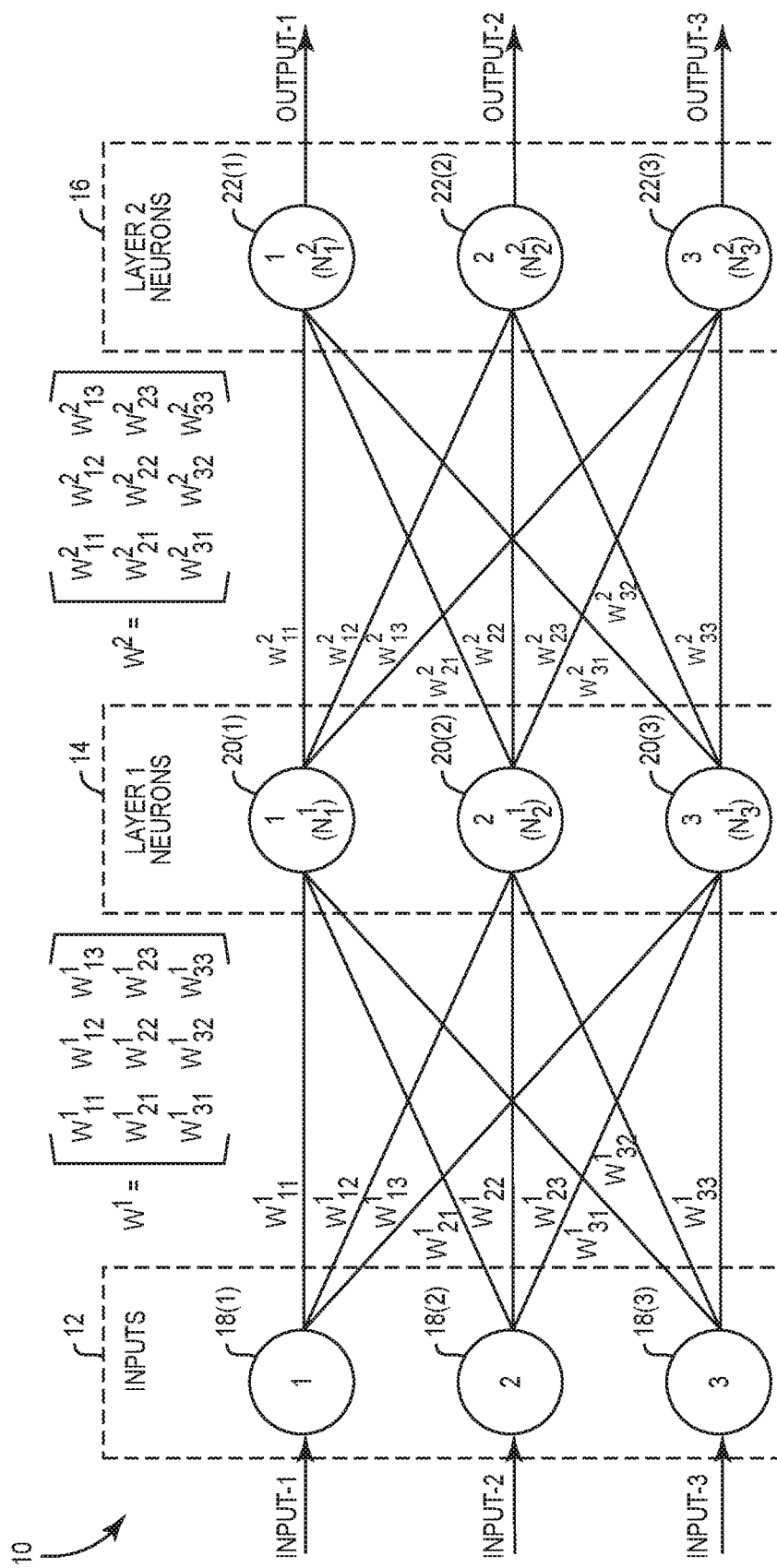
FIG. 1 is a schematic diagram of an exemplary deep neural network (DNN)

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description relate to a multi-layer vector-matrix multiplication (VMM) apparatus for a deep neural network (DNN). In examples discussed herein, the multi-layer VMM apparatus includes a three-dimensional (3D) NAND flash structure having multiple transistor array layers. Specifically, each of the transistor array layers includes a number of transistors configured to store a respective weight matrix and a number of word lines configured to receive respective selection voltages corresponding to a respective input vector. Accordingly, each of the transistor array layers can perform a respective VMM operation by multiplying the respective selection voltages with the respective weight matrix. Thus, by providing the respective selection voltages to each of the multiple transistor array layers in a sequential order, it may be possible to carry out a multi-layer VMM operation in the 3D NAND flash structure. By utilizing the 3D NAND flash structure to carry out the multi-layer VMM operation, it may be possible to reduce footprint of the multi-layer VMM apparatus, thus making it possible to support a DNN via using such advanced techniques as in-memory computing.

Before discussing the multi-layer VMM apparatus of the present disclosure, a brief overview of a DNN is first provided with reference to FIG. 1 to help understand a structure of a DNN and challenges associated with implementing the DNN in a conventional approach. The discussion of specific exemplary aspects of a multi-layer VMM apparatus according to the present disclosure starts below with reference to FIG. 2A.

In this regard, FIG. 1 is a schematic diagram of an exemplary DNN 10. The DNN 10 includes an input layer 12, at least a first neuron layer 14, and at least a second neuron layer 16. The input layer 12 includes three inputs 18(1)-18(3), the first neuron layer 14 includes three first neurons 20(1)-20(3), and the second neuron layer 16 includes three second neurons 22(1)-22(3). Notably, the DNN 10 as illustrated in FIG. 1 is merely a non-limiting example to help explain the structure of the DNN 10. It should be appreciated that the DNN 10 may include tens of neuron layers. Moreover, the input layer 12 may include tens of inputs and each of the first neuron layer 14 and the second neuron layer 16 may include tens of neurons.

In the example discussed herein, the input layer 12 receives an input vector [Input-1, Input-2, Input-3] (also referred to as "at least one first input vector"). A first VMM operation is then performed in the DNN 10 by multiplying the input vector [Input-1, Input-2, Input-3] with a first weight matrix $W^1$ to generate a first neuron vector [$N_1^1$, $N_2^1$, $N_3^1$] (also referred to as "at least one second input vector") in the first neuron layer 14. Subsequently, a second VMM operation is performed in the DNN 10 by multiplying the first neuron vector [$N_1^1$, $N_2^1$, $N_3^1$] with a second weight matrix $W^2$ to generate a second neuron vector [$N_1^2$, $N_2^2$, $N_3^2$] in the second neuron layer 16. Finally, the DNN 10 may generate an output vector [Output-1, Output-2, Output-3] corresponding to the second neuron vector [$N_1^2$, $N_2^2$, $N_3^2$]. Should the DNN 10 include additional neuron layers, then the DNN 10 needs to perform additional VMMs sequentially.

Each of the first VMM operation and the second VMM operation may be carried out by a respective two-dimensional (2D) transistor array. In this regard, to carry out the first VMM operation and the second VMM operation in the DNN 10, at least two 2D transistor arrays are required. Given that the 2D transistor arrays are coupled in series, it may require a larger planar footprint to implement the DNN 10. In this regard, it may require tens of transistor arrays to implement the DNN 10 with tens of neuron layers. As a result, the footprint of the transistor arrays may become prohibitively large, thus making it impractical to implement the DNN 10 based on 2D transistor arrays. As such, it may be desired to support the DNN 10 with a smaller footprint than required by the 2D transistor arrays.

Figure 2A:
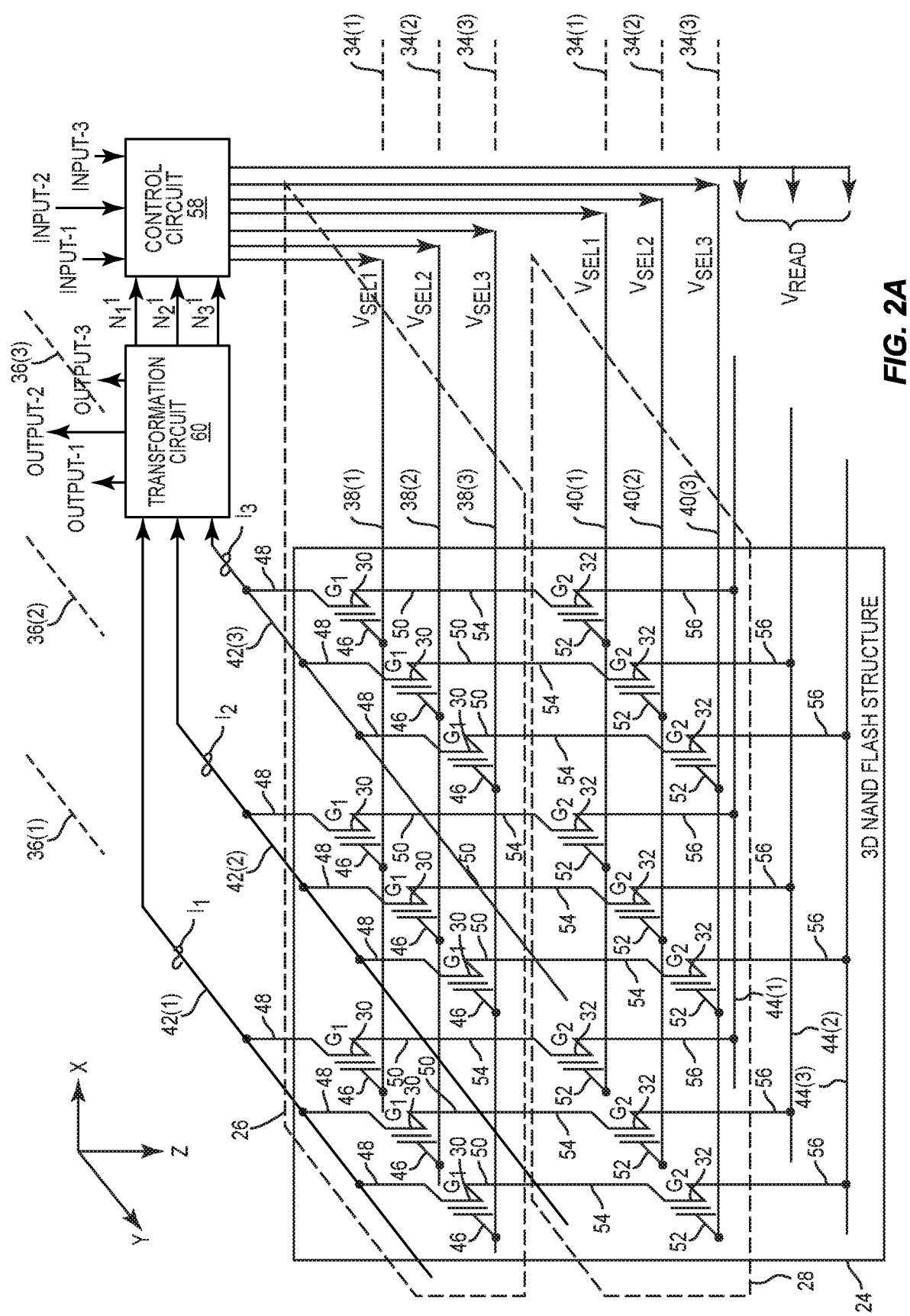
FIG. 2A is a schematic diagram of an exemplary three-dimensional (3D) NAND flash structure configured according to an embodiment of the present disclosure to perform multi-level vector-matrix multiplication (VMM) operations for implementing the DNN of FIG. 1.

In this regard, FIG. 2A is a schematic diagram of an exemplary 3D NAND flash structure 24 configured according to an embodiment of the present disclosure to perform multi-level VMM operations in the DNN 10 of FIG. 1. Common elements between FIGS. 1 and 2 are shown therein with common element numbers and will not be re-described herein.

The 3D NAND flash structure 24 includes at least one first transistor array layer 26 and at least one second transistor array layer 28 coupled to the first transistor array layer 26. In examples discussed herein, the 3D NAND flash structure 24 is configured to support the DNN 10 of FIG. 1. In this regard, the first transistor array layer 26 can be configured to store at least one first weight matrix $W^1$ and perform at least one first VMM operation. Likewise, the second transistor array layer 28 can be configured to store at least one second weight matrix $W^2$ and perform at least one second VMM operation. Thus, the first transistor array layer 26 and the second transistor array layer 28 can collectively implement the DNN 10. As the DNN 10 may include additional neuron layers, it should be appreciated that the 3D NAND flash structure 24 can be configured to include additional transistor array layers for storing additional weight matrixes associated with the additional neuron layers. In a non-limiting example, the additional transistor array layers can be provided between the first transistor array layer 26 and the second transistor array layer 28.

In contrast to the 2D transistor arrays that spread along an x-dimension and/or a y-dimension, the first transistor array layer 26 and the second transistor array layer 28 are stacked along a z-dimension. As such, the 3D NAND flash structure 24 may occupy a smaller footprint than the 2D transistor arrays, thus making it possible to implement the DNN 10 via such advanced techniques as in-memory computing.

The first transistor array layer 26 includes a number of first transistors 30 and the second transistor array layer 28 includes a number of second transistors 32. In a non-limiting example, the first transistors 30 and the second transistors 32 can be floating-gate transistors, charge-trapping transistors, or ferroelectric transistors. The first transistors 30 may be arranged into a number of rows 34(1)-34(3) and a number of columns 36(1)-36(3). The second transistors 32 may likewise be arranged into the rows 34(1)-34(3) and the columns 36(1)-36(3). In this regard, each of the rows 34(1)-34(3) in the first transistor array layer 26 includes three of the first transistors 30 and each of the rows 34(1)-34(3) in the second transistor array layer 28 include three of the second transistors 32. Likewise, each of the columns 36(1)-36(3) in the first transistor array layer 26 includes three of the first transistors 30 and each of the columns 36(1)-36(3) in the second transistor array layer 28 include three of the second transistors 32. As such, each of the first transistor array layer 26 and the second transistor array layer includes a three-by-three (3×3) transistor array.

Although the first transistor array layer 26 and the second transistor array layer 28 are shown in FIG. 2A as both including identical number of rows and columns, it should be appreciated that it may be possible for the first transistor array layer 26 and the second transistor array layer 28 to include different number of rows and/or columns. It should also be appreciated that the rows 34(1)-34(3) and the columns 36(1)-36(3) in FIG. 2A are merely an exemplary implementation of the DNN 10 of FIG. 1. It should be appreciated that, as the DNN 10 can include additional inputs and/or neurons, the first transistor array layer 26 and/or the second transistor array layer 28 may be adapted to include additional rows and/or columns accordingly.

The first transistor array layer 26 includes a number of first word lines 38(1)-38(3) coupled to the first transistors 30 in the rows 34(1)-34(3). Likewise, second transistor array layer 28 includes a number of second word lines 40(1)-40(3) coupled to the second transistors 32 in the rows 34(1)-34(3). Notably, the first word lines 38(1)-38(3) in the first transistor array layer 26 and the second word lines 40(1)-40(3) in the second transistor array layer 28 effectively set the 3D NAND flash structure 24 apart from a conventional 3D NAND flash configured for data storage because each transistor array layer in the conventional 3D NAND flash includes only a single word line.

Figure 2B:
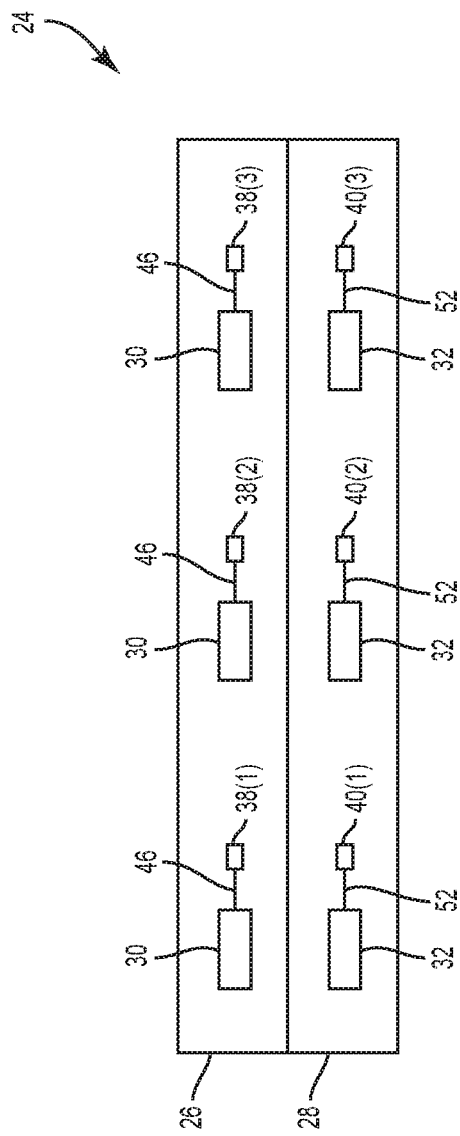
FIG. 2B is a schematic diagram of an exemplary cross-section view of the 3D NAND flash structure of FIG. 2A.

FIG. 2B is a schematic diagram of an exemplary cross-section view of the 3D NAND flash structure 24 of FIG. 2A along a bit line 42(1). Common elements between FIGS. 2A and 2B are shown therein with common element numbers and will not be re-described herein. In one non-limiting example, the first transistor array layer 26 and the second transistor array layer 28 can be provided in separate substrates. In another non-limiting example, the first transistor array layer 26 and the second transistor array layer 28 can be integrated into a single substrate. It should be appreciated that the 3D NAND flash structure 24 can be configured to support multi-layer VMM operation independent of fabrication of the 3D NAND flash structure 24.

With reference back to FIG. 2A, the 3D NAND flash structure 24 includes a number of bit lines 42(1)-42(3) and a number of source lines 44(1)-44(3). The bit lines 42(1)-42(3) may be coupled to the columns 36(1)-36(3), respectively, and the source lines 44(1)-44(3) may be coupled to the rows 34(1)-34(3), respectively. In a non-limiting example, the first transistor array layer 26 is coupled directly to the bit lines 42(1)-42(3) and the second transistor array layer 28 is coupled directly to the source lines 44(1)-44(3). Accordingly, the first transistor array layer 26 is coupled to the source lines 44(1)-44(3) via the second transistor array layer 28 and the second transistor array layer 28 is coupled to the bit lines 42(1)-42(3) via the first transistor array layer 26.

In the first transistor array layer 26, each of the first transistors 30 has a first gate electrode 46 coupled to a respective first word line among the first word lines 38(1)-38(3). Each of the first transistors 30 also has a first source electrode 48 coupled to a respective bit line among the bit lines 42(1)-42(3). Each of the first transistors 30 also has a first drain electrode 50. In the second transistor array layer 28, each of the second transistors 32 has a second gate electrode 52 coupled to a respective second word line among the second word lines 40(1)-40(3). Each of the second transistors 32 also has a second source electrode 54 coupled to a respective first drain electrode 50. Each of the second transistors 32 also has a first drain electrode 56 coupled to a respective source line among the source lines 44(1)-44(3).

The first transistor array layer 26 is configured to store the first weight matrix $W^1$ by pre-programming the first transistors 30 to a number of first channel conductances $G_1$. To configure the first transistor array layer 26 to perform the first VMM operation, the bit lines 42(1)-42(3) are coupled to a ground, a read voltage $V_{READ}$ is provided to the source lines 44(1)-44(3), and a number of selection voltages $V_{SEL1}$, $V_{SEL2}$, $V_{SEL3}$ are provided respectively to the first word lines 38(1)-38(3). In a non-limiting example, the read voltage $V_{READ}$ can equal approximately 0.5 V and the selection voltages $V_{SEL1}$, $V_{SEL2}$, $V_{SEL3}$ can be between 1 V and 2.5 V. In this regard, the read voltage $V_{READ}$ is smaller than any of the selection voltages $V_{SEL1}$, $V_{SEL2}$, $V_{SEL3}$. The selection voltages $V_{SEL1}$, $V_{SEL2}$, $V_{SEL3}$ and the first channel conductance $G_1$ cause a number of currents $I_1$, $I_2$, and $I_3$ (also known as "first currents") to flow from the source lines 44(1)-44(3) toward the bit lines 42(1)-42(3). Given that each of the currents $I_1$, $I_2$, and $I_3$ corresponds to a multiplication of the selection voltages $V_{SEL1}$, $V_{SEL2}$, $V_{SEL3}$ and the first channel conductance $G_1$, it can be said that the currents $I_1$, $I_2$, and $I_3$ represent a result of the first VMM operation.

Likewise, the second transistor array layer 28 is configured to store the second weight matrix $W^2$ by pre-programming the second transistors 32 to a number of second channel conductances $G_2$. To configure the second transistor array layer 28 to perform the second VMM operation, the bit lines 42(1)-42(3) are coupled to a ground, a read voltage $V_{READ}$ is provided to the source lines 44(1)-44(3), and the number of selection voltages $V_{SEL1}$, $V_{SEL2}$, $V_{SEL3}$ are provided respectively to the second word lines 40(1)-40(3). The selection voltages $V_{SEL1}$, $V_{SEL2}$, $V_{SEL3}$ and the second channel conductance $G_2$ cause the number of currents $I_1$, $I_2$, and $I_3$ (also known as "second currents") to flow from the source lines 44(1)-44(3) toward the bit lines 42(1)-42(3). Given that each of the currents $I_1$, $I_2$, and $I_3$ now corresponds to a multiplication of the selection voltages $V_{SEL1}$, $V_{SEL2}$, $V_{SEL3}$ and the second channel conductance $G_2$, it can be said that the currents $I_1$, $I_2$, and $I_3$ now represent a result of the second VMM operation.

The 3D NAND flash structure 24 may be coupled to a control circuit 58. The control circuit 58 can be configured to control the 3D NAND flash structure 24 to perform the first VMM operation and the second VMM operation in a sequential order. More specifically, the control circuit 58 first selects the first transistor array layer 26 to perform the first VMM operation by providing the selection voltages $V_{SEL1}$, $V_{SEL2}$, $V_{SEL3}$ to the first word lines 38(1)-38(3), respectively. In this regard, the control circuit 58 receives the input vector [Input-1, Input-2, Input-3] and generates the selection voltages $V_{SEL1}$, $V_{SEL2}$, $V_{SEL3}$ based on the input vector [Input-1, Input-2, Input-3]. For example, if the input vector corresponds to [0, 1, 0], then the control circuit 58 can generate the selection voltages $V_{SEL1}$, $V_{SEL2}$, $V_{SEL3}$ as LOW, HIGH, LOW accordingly. When the first transistor array layer 26 completes the first VMM operation, a transformation circuit 60 may be configured to sense the currents $I_1$, $I_2$, and $I_3$ flowing through the bit lines 42(1)-42(3). Accordingly, the transformation circuit 60 may transform the current $I_1$, $I_2$, and $I_3$ into the first neuron vector $[N_1^1, N_2^1, N_3^1]$ and provides the first neuron vector $[N_1^1, N_2^1, N_3^1]$ to the control circuit 58.

The control circuit 58 generates a number of selection voltages $V_{SEL1}$, $V_{SEL2}$, $V_{SEL3}$ based on the first neuron vector $[N_1^1, N_2^1, N_3^1]$. Subsequently, the control circuit 58 selects the second transistor array layer 28 to perform the second VMM operation by providing the selection voltages $V_{SEL1}$, $V_{SEL2}$, $V_{SEL3}$ to the second word lines 40(1)-40(3), respectively. When the second transistor array layer 28 completes the second VMM operation, the transformation circuit 60 may be configured to sense the currents $I_1$, $I_2$, and $I_3$ flowing through the bit lines 42(1)-42(3). Accordingly, the transformation circuit 60 may transform the current $I_1$, $I_2$, and $I_3$ into the output vector [Output-1, Output-2, Output-3].

Notably, when the first transistor array layer 26 performs the first VMM operation, the currents $I_1$, $I_2$, $I_3$ would flow from the source lines 44(1)-44(3) toward the bit lines 42(1)-42(3) through the second transistors 32 in the second transistor array layer 28. In this regard, it may be desired for the second transistors 32 to each function like a short circuit to reduce interference to the currents $I_1$, $I_2$, $I_3$ and, thus, helping to improve accuracy of the first VMM operation. Likewise, when the second transistor array layer 28 performs the second VMM operation, the currents $I_1$, $I_2$, $I_3$ would flow from the source lines 44(1)-44(3) toward the bit lines 42(1)-42(3) through the first transistors 30 in the first transistor array layer 26. In this regard, it may be desired for the first transistors 30 to each function like a short circuit to reduce interference to the currents $I_1$, $I_2$, $I_3$ and, thus, helping to improve accuracy of the second VMM operation. In this regard, as discussed next in FIG. 3, it may be possible to configure the control circuit 58 to selectively reduce channel resistance in the second transistors 32 and the first transistors 30 when selecting the first transistor array layer 26 and the second transistor array layer 28 to perform the first VMM operation and the second VMM operation, respectively.

Figure 3:
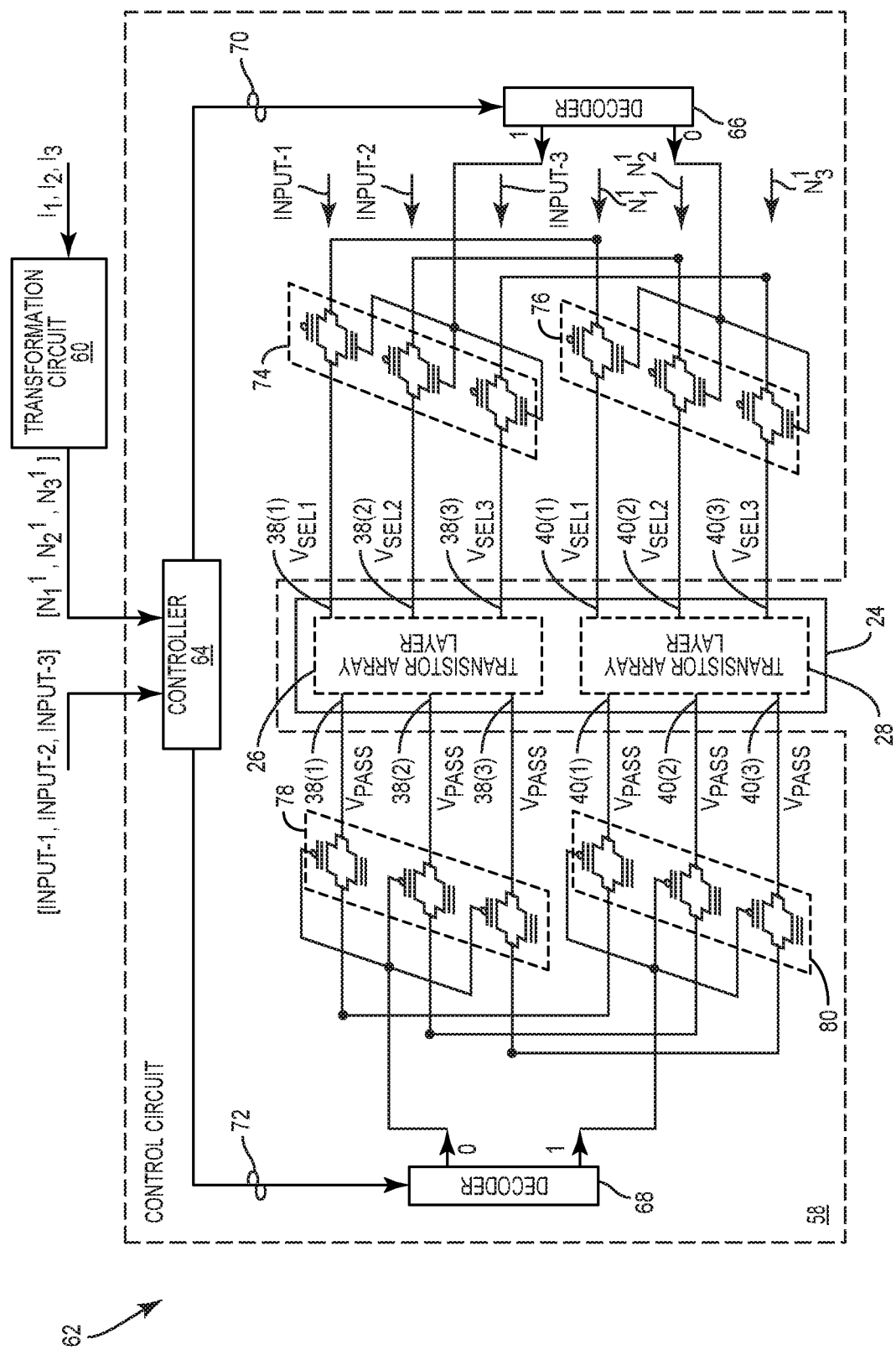
FIG. 3 is a schematic diagram of an exemplary multi-layer VMM apparatus incorporating the 3D NAND flash structure of FIG. 2A.

In this regard, FIG. 3 is a schematic diagram of an exemplary multi-layer VMM apparatus 62 incorporating the 3D NAND flash structure 24 of FIG. 2A. Common elements between FIGS. 2A and 3 are shown therein with common element numbers and will not be re-described herein.

The control circuit 58 may include a controller 64, a first decoder 66, and a second decoder 68. Also, although the first decoder 66 and the second decoder 68 are shown in FIG. 3 as being provided in separate circuits, it should be appreciated that the first decoder 66 and the second decoder 68 may be integrated into a single decoder circuit without affecting operational principles discussed herein.

In a non-limiting example, the first decoder 66 is configured to alternately enable the first transistor array layer 26 and the second transistor array layer 28 to perform the first VMM operation and the second VMM operation, respectively. The second decoder 68, on the other hand, is configured to alternately disable the second transistor array layer 28 and the first transistor array layer 26 during the first VMM operation and the second VMM operation, respectively. More specifically, the first decoder 66 can output a binary word [1, 0] (e.g., logical HIGH and LOW) to enable at least one first selection voltage circuit 74 and output a binary word [0, 1] (e.g., logical LOW and HIGH) to enable at least one second voltage selection circuit 76.

The first decoder 66 and the second decoder 68 may be configured to operate in a lock-step fashion. In this regard, the second decoder 68 is configured to disable the second transistor array layer 28 concurrent to the first decoder 66 enabling the first transistor array layer 26 for the first VMM operation. Likewise, the second decoder 68 is configured to disable the first transistor array layer 26 concurrent to the first decoder 66 enabling the second transistor array layer for the second VMM operation.

The controller 64 may be configured to provide a first control signal 70 and a second control signal 72 to the first decoder 66 and the second decoder 68, respectively. The first control signal 70 may provide indication to the first decoder 66 as to which of the first transistor array layer 26 and the second transistor array layer 28 should be selected. The second control signal 72 may provide indication to the second decoder 68 as to which of the first transistor array layer 26 and the second transistor array layer 28 should be deselected. Notably, the controller 64 may be configured to provide concurrently the first control signal 70 and the second control signal 72 such that the first decoder 66 and the second decoder 68 can operate in the lock-step fashion.

During the first VMM operation, the controller 64 may be configured to receive the input vector [Input-1, Input-2, Input-3] and provide the input vector [Input-1, Input-2, Input-3] to the first selection voltage circuit 74. Accordingly, the first decoder 66 may enable the first selection voltage circuit 74 to generate the selection voltages $V_{SEL1}$, $V_{SEL2}$, $V_{SEL3}$ corresponding to the input vector [Input-1, Input-2, Input-3] and provide the selection voltages $V_{SEL1}$, $V_{SEL2}$, $V_{SEL3}$ to the first word lines 38(1)-38(3). During the second VMM operation, the controller 64 may be configured to receive the first neuron vector [$N_1^1$, $N_2^1$, $N_3^1$] from the transformation circuit 60 and provide the first neuron vector [$N_1^1$, $N_2^1$, $N_3^1$] to the second selection voltage circuit 76. Accordingly, the second selection voltage circuit 76 may generate the selection voltages $V_{SEL1}$, $V_{SEL2}$, $V_{SEL3}$ corresponding to the first neuron vector [$N_1^1$, $N_2^1$, $N_3^1$] and provide the selection voltages $V_{SEL1}$, $V_{SEL2}$, $V_{SEL3}$ to the second word lines 40(1)-40(M).

The control circuit 58 may include at least one first passage voltage circuit 78 and at least one second passage voltage circuit 80. In this regard, during the first VMM operation, the second decoder 68 may output a binary word [0, 1] (e.g., logical LOW and HIGH) to cause the second passage voltage circuit 80 to provide the passage voltage $V_{PASS}$ to the second word lines 40(1)-40(3). Likewise, during the second VMM operation, the second decoder 68 may output a binary word [1, 0] (e.g., logical HIGH and LOW) to cause the first passage voltage circuit 78 to provide the passage voltage $V_{PASS}$ to the first word lines 38(1)-38(3).

The passage voltage $V_{PASS}$ may be so chosen to be higher than respective threshold voltages of the first transistors 30 and the second transistors 32. As such, when the passage voltage $V_{PASS}$ is applied to the first transistors 30, the first transistors 30 may become conductive and present little channel resistance. Similarly, when the passage voltage $V_{PASS}$ is applied to the second transistors 32, the second transistors 32 may become conductive and present little channel resistance. In a non-limiting example, the passage voltage $V_{PASS}$ can equal approximately 8 V. In this regard, the passage voltage $V_{PASS}$ is higher than the read voltage $V_{READ}$ (e.g., 0.5 V) as well as any of the selection voltages $V_{SEL1}$, $V_{SEL2}$, $V_{SEL3}$ (e.g., between 1 V and 2.5 V).

Those skilled in the art will recognize improvements and modifications to the preferred embodiments of the present disclosure. All such improvements and modifications are considered within the scope of the concepts disclosed herein and the claims that follow.

What is claimed is:

1. A multi-layer vector-matrix multiplication (VMM) apparatus comprising:
 a three-dimensional (3D) NAND flash structure comprising:
  at least one first transistor array layer coupled to a plurality of bit lines and comprising:
   a plurality of first transistors configured to store at least one first weight matrix; and
   a plurality of first word lines configured to receive a plurality of selection voltages corresponding to at least one first input vector; and
  at least one second transistor array layer coupled between the at least one first transistor array layer and a plurality of source lines and comprising:
   a plurality of second transistors configured to store at least one second weight matrix; and
   a plurality of second word lines configured to receive the plurality of selection voltages corresponding to at least one second input vector; and
 a control circuit configured to:
  concurrently enable the at least one first transistor array layer and disable the at least one second transistor array layer to cause the at least one first transistor array layer to perform at least one first VMM operation to multiply the at least one first input vector with the at least one first weight matrix;
  concurrently disable the at least one first transistor array layer and enable the at least one second transistor array layer to cause the at least one second transistor array layer to perform at least one second VMM operation to multiply the at least one second input vector with the at least one second weight matrix; and
  couple the plurality of bit lines to a ground and provide a read voltage to the plurality of source lines during the at least one first VMM operation and the at least one second VMM operation;
 wherein the control circuit comprises:
  a first decoder configured to enable the at least one first transistor array layer to cause the plurality of selection voltages to be provided to the plurality of first word lines, respectively, to perform the at least one first VMM operation;
  a second decoder configured to provide a passage voltage to the plurality of second word lines to disable the at least one second transistor array layer concurrent to the first decoder enabling the at least one first transistor array layer; and
  a controller configured to:
   cause the at least one first input vector to be provided to the plurality of first word lines, respectively, concurrent to controlling the first decoder to enable the at least one first transistor array layer;
   cause the passage voltage to be provided to the plurality of second word lines concurrent to controlling the second decoder to disable the at least one second transistor array layer;
cause the at least one second input vector to be provided to the plurality of second word lines, respectively, concurrent to controlling the first decoder to enable the at least one second transistor array layer; and
cause the passage voltage to be provided to the plurality of first word lines concurrent to controlling the second decoder to disable the at least one first transistor array layer.

2. The multi-layer VMM apparatus of claim 1 wherein the control circuit is further configured to cause the at least one first transistor array layer to perform the at least one first VMM operation prior to causing the at least one second transistor array layer to perform the at least one second VMM operation.

3. The multi-layer VMM apparatus of claim 1 wherein the first decoder and the second decoder are integrated into a single decoder circuit.

4. The multi-layer VMM apparatus of claim 1 wherein:
the first decoder is further configured to enable the at least one second transistor array layer to cause the plurality of selection voltages to be provided to the plurality of second word lines, respectively, to perform the at least one second VMM operation; and
the second decoder is further configured to provide the passage voltage to the plurality of first word lines to disable the at least one first transistor array layer concurrent to the first decoder enabling the at least one second transistor array layer.

5. The multi-layer VMM apparatus of claim 4 wherein:
the second decoder is further configured to generate the passage voltage higher than any of the plurality of selection voltages; and
the control circuit is further configured to generate the read voltage lower than any of the plurality of selection voltages.

6. The multi-layer VMM apparatus of claim 3 wherein:
the plurality of first transistors is configured to:
store the at least one first weight matrix as a plurality of first channel conductances; and
multiply the plurality of selection voltages with the plurality of first channel conductances in the at least one first VMM operation to generate a plurality of first currents; and
the plurality of second transistors is configured to:
store the at least one second weight matrix as a plurality of second channel conductances; and
multiply the plurality of selection voltages with the plurality of second channel conductances in the at least one second VMM operation to generate a plurality of second currents.

7. The multi-layer VMM apparatus of claim 6 further comprising a transformation circuit configured to sense and transform the plurality of first currents into the at least one second input vector.

8. The multi-layer VMM apparatus of claim 7 wherein the transformation circuit is further configured to sense and transform the plurality of second currents into an output vector.

9. The multi-layer VMM apparatus of claim 1 wherein:
the plurality of first transistors in the at least one first transistor array layer is organized into a plurality of rows and a plurality of columns, the plurality of rows in the at least one first transistor array layer is coupled to the plurality of first word lines, respectively; and
the plurality of second transistors in the at least one second transistor array layer is organized into the plurality of rows and the plurality of columns, the plurality of rows in the at least one second transistor array layer is coupled to the plurality of second word lines, respectively.

10. The multi-layer VMM apparatus of claim 9 wherein:
each of the plurality of rows in the at least one first transistor array layer comprises one or more first transistors among the plurality of first transistors, the one or more first transistors comprise one or more first gate electrodes coupled to a respective first word line among the plurality of first word lines; and
each of the plurality of rows in the at least one second transistor array layer comprises one or more second transistors among the plurality of second transistors, the one or more second transistors comprise one or more second gate electrodes coupled to a respective second word line among the plurality of second word lines.

* * * * *